(12) United States Patent
Eisenhammer et al.

(10) Patent No.: US 7,019,264 B2
(45) Date of Patent: Mar. 28, 2006

(54) HEAT-TREATMENT SYSTEM AND METHOD

(75) Inventors: Thomas Eisenhammer, Azmoos (CH); Thomas Matt, Gofis (AT); Gebhard Stittmatter, Constance (DE); Klaus Zapf, Bretten (DE)

(73) Assignee: Unaxis Balzers Ltd., Liechtenstein (LI)

( * ) Notice: Subject to any disclaimer, the term of this patent is extended or adjusted under 35 U.S.C. 154(b) by 0 days.

(21) Appl. No.: 10/818,827

(22) Filed: Apr. 6, 2004

(65) Prior Publication Data
US 2005/0035108 A1    Feb. 17, 2005

Related U.S. Application Data

(60) Provisional application No. 60/463,481, filed on Apr. 17, 2003.

(51) Int. Cl.
*F26B 15/04*    (2006.01)

(52) U.S. Cl. .................. 219/392; 219/388; 219/400; 34/216

(58) Field of Classification Search ............... 219/388, 219/392, 408, 402; 34/498, 500, 501, 545, 34/216
See application file for complete search history.

(56) References Cited

FOREIGN PATENT DOCUMENTS

| DE | 199 04 045 C1 | | 2/1999 |
|---|---|---|---|
| EP | 0 399 616 | | 11/1990 |
| GB | 2279585 | A * | 1/1995 |
| JP | 63-244429 | A * | 10/1988 |

* cited by examiner

*Primary Examiner*—Joseph Pelham
(74) *Attorney, Agent, or Firm*—Pearne & Gordon LLP

(57) ABSTRACT

This invention relates to a system and a method for the heat treatment of substrates, incorporating an annular heat-treatment section with a rotary table designed to accept substrate holders, at least two of which substrate holders are positioned one behind the other in heat-treatment zones that extend in a radial spoke pattern around the center of the rotary table.

9 Claims, 1 Drawing Sheet

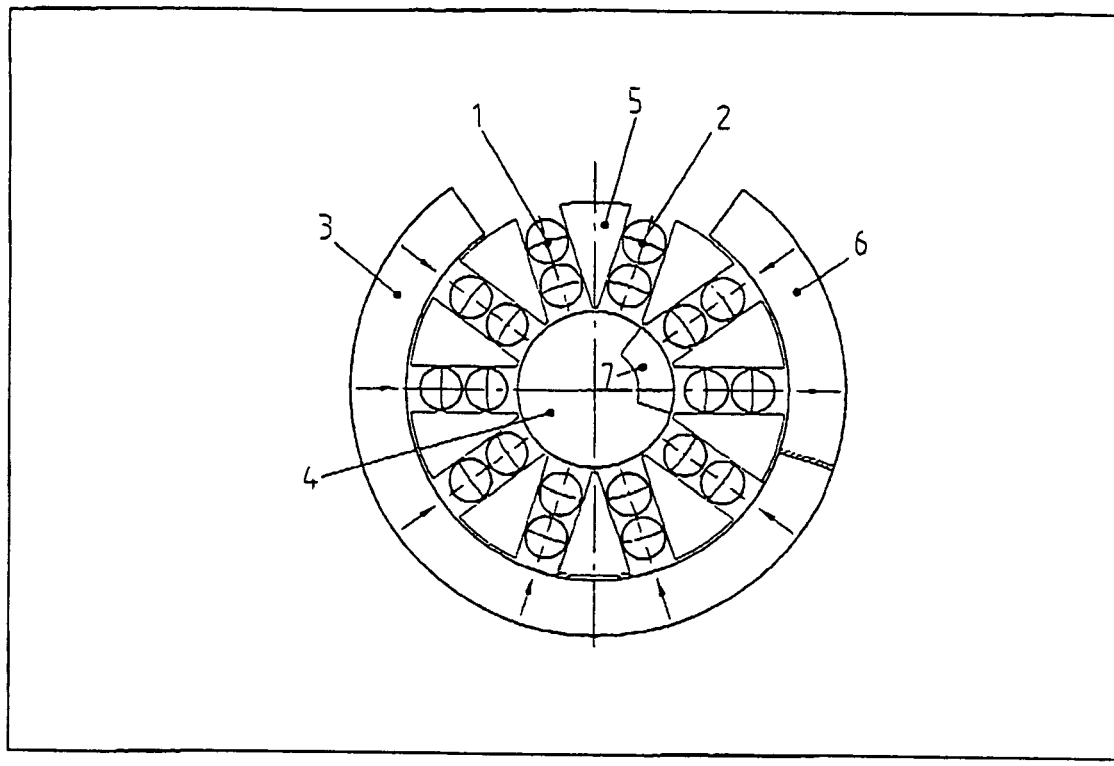

HEAT-TREATMENT SYSTEM AND METHOD

FIELD OF TECHNOLOGY

This invention relates to a system and a method for the heat treatment of substrates and in particular of liquid-coated plastic substrates used in producing data storage disks, as specified in claim 1. The invention further describes a method for operating such a system.

1. Background of the Invention

In the manufacture of storage disks such as CDs or DVDs, certain procedural steps involve the coating of the substrates with adhesives, dyes or other layers that must be dry before the next production step can take place. The application can be performed for instance by a printing process, by spin coating or in some other fashion. The dyes and adhesives often contain solvents or alcohols.

As another known aspect, polycarbonates that often serve as the plastic substrates typically contain, or are capable of absorbing, water at about 0.3% by weight. That is a drawback in many of the vacuum coating processes because water is outgassed in a vacuum, negatively affecting the vacuum conditions and the coating quality (for instance of magneto-optical data storage disks), resulting in most cases in the need for extended pump-down times.

In an effort to shorten the process times and to compensate for the drawbacks mentioned above, the substrates are dried in an oven under controlled conditions. Concurrently, it is possible to combine with the thermal treatment a sintering or chemical or physical conversion process (changing the refractive index of an applied layer, for example).

Usually, under atmospheric conditions, the storage-disk substrates are heat-treated i.e. dried at 60–120° C. for typically 5 to 20 minutes. Depending on the throughput of the production process it may be necessary in a system of that type to retain a substantial number of substrates in an interim holding area, given that the capacity of storage-disk drying ovens typically varies between 50 and 1200 substrates.

The general objective for that type of heat-treatment system, hereinafter frequently and briefly referred to as an oven without being limited thereto, is to provide good loading and unloading capabilities, controlled drying conditions, a compact design, and low energy consumption.

2. Prior Art

In prior-art drying system designs of this type the object substrates are dried in a heatable tunnel either by irradiation or in a flow of gas. The substrates are supported by holders that are attached to screw spindles whose rotation moves the substrates forward. Both upright and horizontal system designs have been used. In the case of extended drying times and/or large substrate quantities the screw spindles need to be very long, the result being the spatial separation of the loading and unloading stations. Because the substrates are held by their outer edge, the holders are susceptible to contamination especially in the case of spin-coated substrates.

As an alternative to the screw spindles, the substrates to be dried may be collected in baskets or retainers or positioned on spindles in a way as to permit batch drying. In the drying oven they can then be placed on rotary tables or in a linear array (tunnel concept).

One earlier form of implementation is described in DE 199 04 045 C1. It provides for the substrates to be placed on a spindle and dried in an air current inside a rotating oven. The heating device is located in the central area of the oven. The drawback of that concept is that, as the throughput capacity is increased, the oven diameter must be augmented quite substantially. Moreover, the air current inside the oven circulates past all of the disks, which leaves little latitude in terms of the homogeneity and controllability of the drying process.

OBJECTIVE OF THE INVENTION

It is the objective of this invention to introduce a system and a method for drying substrates and especially storage disks that avoids the shortcomings of prior art. In particular, the invention is intended to permit a larger substrate throughput with a system having compact dimensions as well as individual zones for thermal processing. The drying process is to be homogeneous and controllable over a wide range. Another objective of this invention is a simplified structural design that permits energy savings in comparison with prior art.

The invention here described achieves these objectives. The following will explain the invention in more detail based on a few design examples and comparisons and with the aid of the attached drawing.

SOLUTION PER THIS INVENTION

FIG. 1 shows a drying system according to the invention. The configuration, essentially circular as viewed from the top, consists of an outer jacket section 3 and 6, a core section 4 and, in between, the actual heat-treatment area featuring heat-treatment zones in a spoke-shaped array and with interstitial sectors 5. Depending on the design, the system can encompass from 6 to 20 heat-treatment zones. An opening in the jacket section 3, 6 is provided to constitute the loading and unloading ports 1 and 2.

The drying system includes a rotary table (not shown) with receptacles for substrate holders supporting the substrates loaded (in the example shown) on spindles. These spindles may consist for instance of a central arbor that accepts the substrates, separated from one another by a spacer, via their central holes. Other loading modes may be used without deviating from the underlying concept of this invention. Positioning the spindles one behind the other in radial fashion produces a configuration in which, viewed from above, they are arrayed, one behind the other in the spokes, concentrically around the center of the rotating table.

Depending on the size of the substrates it will be desirable to position at least 2 or 3 or more spindles one behind the other, creating corresponding concentric patterns.

In one design version of the invention, the jacket section 3 incorporates heating as well as gas-propulsion devices and, if necessary, particle filters, for generating a hot gas or air current radially flowing from the outside toward the inside core section 7 where for instance the air current is deflected and directed back into the jacket section 3 by way of a conduit (not shown) positioned on the top surface of the oven. This permits access from the outside, for maintenance purposes, to the heating device and for instance to the blower system while obviating the need for moving parts in the core area 7. The conduit may even incorporate a hygrometer and a temperature gauge for monitoring the condition of the gas. Depending on the application, part of the gas or air current may then be exhausted and replaced with fresh air. By means of a heat exchanger the exhaust air can be cooled and the fresh air preheated, which further reduces energy consumption.

Conversely, it is also possible to channel the air flow from the inside to the outside, in which case the heating elements are preferably mounted in a central location. Both configurations offer the advantages described below.

By means of the partitions 5 the air current can be directionally guided and especially made uniform, which in turn helps create uniform heat-treatment conditions for the substrates. The radial orientation of the air flow, in combination with the partitions, makes it possible to create different temperature ranges in different regions of the jacket section, for which purpose the (fixed) air intake zones of the jacket section 3 are fed air currents in different temperature ranges.

AN EXAMPLE OF THE METHOD PER THIS INVENTION

At port 1, substrates placed on spindles are loaded into the heat treatment system and are held in place by means of suitable holders. In this example, the shaft-shaped section constituting the heat-treatment zone accommodates two spindles, one behind the other in the radial direction. Each heat treatment zone borders on 2 walls that are part of the neighboring interstitial sectors or partitions 5. The heat-treatment zone and the interstitial sectors revolve on a rotary table. Said rotary table is preferably motor-driven in controlled fashion, for instance for slow continuous rotation or for stepped movement at intervals each of which advances the rotary table by an angle of rotation that takes each heat-treatment zone to its respective next position. For the purposes of this example a counterclockwise rotation is assumed. Next, the spindles are subjected to the heat treatment whereupon they advance to the unloading port 2.

As mentioned above it is possible, by heating the intake air to different temperature levels or varying the amount of air in the different zones of the jacket 3, to obtain graduated thermal treatment. That permits controlled substrate heating patterns including for instance the avoidance of temperature surges or discontinuities, which in turn can help prevent substrate deformations.

By way of example, section 6 in FIG. 1 is designed as a cooling zone. There the intake blowers feed cooling air to the substrates, ensuring a handling temperature that might have to be attained before further processing can take place. As a desirable option, the cooling air that is heated up by the substrates can be fed to the heat generators in section 3, thus helping to lower the energy requirements of the overall system. It is equally possible, however, to vent the cooling air via a separate exhaust flue 7.

The design of the interstitial partitions 5 obviates the need to provide an additional cover for the loading and unloading ports. As is clearly shown in FIG. 1, the radial outside walls of the partitions 5, matching the circular curvature, block off the interior regions of the oven, thus preventing energy losses. Moreover, mechanically operated components such as doors, gates or rotatable obturators can be dispensed with.

Depending on the application and on the cycle times, the loading and unloading ports can be functionally combined into one. Where permitted by the cycle rate, one single port may suffice for sequential unloading and reloading, with the further advantage that only one handling system is needed instead of two.

OTHER ADVANTAGES OF THIS INVENTION

Providing the spindles with rotary drives allows them to rotate during the heat-treating process, resulting in more uniform heating. The rotary drives may be operated by individual electric motors or jointly via gears that mesh with a stationary gear rim.

Installing sensors in the heat-treatment zones permits the individual monitoring of the temperature pattern in each heat-treatment zone. By means of a corresponding evaluation unit such as a PC it will thus be possible to intervene with corrective measures or to set the temperature curve along default values. In parallel fashion, the same evaluation unit can monitor the humidity and temperature controls for the intake and exhaust air.

What is claimed is:

1. System for the heat treatment of substrates, incorporating an annular heat-treatment section that includes a rotary table designed to accept substrate holders, a core section around the central axis of the rotary table, a heating jacket section and a cooling jacket section surrounding a heat-treatment area comprised of multiple heat-treatment zones, a loading and unloading port area for the substrate holders, at least one heat source for heating a gas current, and gas flow conduits, characterized in that at least two substrate holders are positioned one behind the other in each heat-treatment zone which in turn are positioned in a radial spoke pattern around the center of the rotating table.

2. System as in claim 1, characterized in that the heat-treatment zones are separated by interstitial sectors having walls that laterally partition the heat-treatment zones from one another in parallel-spoke fashion.

3. System as in claim 1, characterized in that the rotary table can be motor-driven around its central axis of rotation.

4. System as in claim 1, characterized in that the heat source is situated in the heating and cooling jacket sections and that the gas flow conduits direct the gas flow from the heating and cooling jacket sections radially through the heat-treatment zones and to the said central axis.

5. System as in claim 1, characterized in that in terms of temperature and/or volume the gas current from at least one part of the heating and cooling jacket sections differs from the gas current flowing from the remaining heating and cooling jacket sections.

6. System as in claim 5, characterized in that the gas current emanating from the cooling jacket section is cooler than the gas current coming from the heating jacket section and serves to cool the substrates.

7. Method for heat-treating substrates in a system as in claim 1, characterized in that during operation the rotary table rotates in discontinuous fashion at controlled intervals, in each case stepped far enough to realign the heat-treatment zones but advanced by one to the next position.

8. Method for heat-treating substrates as in claim 7, characterized in that the gas flow conduits are so configured that the gas current flows through the heat-treatment zones in essentially uniform fashion.

9. Method for heat-treating substrates as in claim 7, characterized in that the gas current used for cooling purposes subsequently serves as an air supply for the heat source of the gas current.

* * * * *

UNITED STATES PATENT AND TRADEMARK OFFICE
CERTIFICATE OF CORRECTION

PATENT NO. : 7,019,264 B2
APPLICATION NO. : 10/818827
DATED : March 28, 2006
INVENTOR(S) : Eisenhammer et al.

It is certified that error appears in the above-identified patent and that said Letters Patent is hereby corrected as shown below:

Title page,
Item [75] Inventors, please delete "Stittmatter, Constance," and insert --Strittmatter, Konstanz--.

Signed and Sealed this

Fourth Day of July, 2006

JON W. DUDAS
*Director of the United States Patent and Trademark Office*